United States Patent [19]

Christophersen

[11] Patent Number: 5,077,756

[45] Date of Patent: Dec. 31, 1991

[54] DATA NETWORK LINE DRIVER

[75] Inventor: James Christophersen, West Islip, N.Y.

[73] Assignee: Acculan Ltd., East Northport, N.Y.

[21] Appl. No.: 531,009

[22] Filed: May 31, 1990

[51] Int. Cl.⁵ .................. H04B 3/00; H03K 17/60
[52] U.S. Cl. .................................. 375/36; 330/195; 330/276; 330/255; 307/253
[58] Field of Search ................. 375/7, 36; 178/63 B; 330/255, 262, 263, 276, 301, 195, 207 A; 307/253, 254, 255

[56] References Cited

U.S. PATENT DOCUMENTS

| | | | |
|---|---|---|---|
| 2,990,516 | 6/1961 | Johannessen | 330/207 A |
| 4,079,271 | 5/1978 | Peil | 307/255 |
| 4,121,118 | 10/1978 | Mizazaki | 375/36 |
| 4,445,222 | 4/1984 | Smith | 375/36 |
| 4,479,228 | 10/1984 | Crane | 375/7 |
| 4,615,039 | 9/1986 | Li et al. | 375/36 |
| 4,943,979 | 7/1990 | Webber, Jr. | 375/7 |

Primary Examiner—Benedict V. Safourek
Assistant Examiner—Young Tse
Attorney, Agent, or Firm—Bauer & Schaffer

[57] ABSTRACT

A line driver for a cable linked LAN maintains a high impedance across the cable when not sending data. A pulse transformer includes a primary and secondary winding. The primary winding of the transformer is placed between a first pair of transistors and a second pair of transistors. An array of switching inverters activates these transistors in such a manner whereby, when one pair is turned on, the other pair is turned off. This "off" and "on" toggling of the transistor pairs drives current into the transformer primary. Such current induces a pulse in the transformer secondary which is coupled into the LAN cable.

5 Claims, 2 Drawing Sheets

DATA NETWORK LINE DRIVER

FIELD OF THE INVENTION

This invention relates to a data transmission device and more particularly to a line driver for use in a Local Area Network.

BACKGROUND OF THE INVENTION

A Local Area Network (commonly referred to as LAN) permits data transmission and sharing of such information between discrete terminal devices such as computer terminals, peripheral equipment and similar work stations. Reference to the form and function of a typical system is shown in U.S. Pat. No. 4,775,864 dated Oct. 4, 1988 can be made for an explanation of an illustrative LAN and connections thereto.

Many LANS employ coaxial cable or twisted lines to interconnect the various nodes and hubs to which the terminal devices. Ideally one would want to be able to link as many devices to the LAN as one needs in a given network. The problem, however, is that as each device is coupled into the LAN, it places an output impedance in parallel across the coaxial cable or lines which interconnect and form the LAN. As devices are added to the LAN, these parallel impedances combine to reduce the presented impedance of the LAN interconnecting cable. A point is reached where the actual impedance of the interconnecting LAN line is brought so low that severe mismatch is created on this line. This leads to ringing, pulse (data) distortion, and other unwanted effects.

There are many circuits which are designed to act as an interface between a given device and the LAN. Most often these circuits employ complex arrangements and circuitry to maintain a high impedance when coupled to the interconnecting cables of the LAN. When the interface device presents a significantly higher impedance than the characteristic impedance of the LAN interconnecting cable many such interface devices can be placed across the LAN cable before a serious effect on the measured impedance of same is noticed. While such high impedance interface apparata is available, often times they involve complicated circuitry. This leads to considerable expense in implementation and attendant reliability considerations.

SUMMARY OF THE INVENTION

The present invention is designed to overcome several of the drawbacks of prior LAN interface circuitry. In general, the present invention comprises a LAN transmitter or interface which is designed to couple a given terminal device, node or hub (i.e, computer, printer, large memory bank) to the LAN. In general the present invention uses a simple pulse transformer which, on one side, is driven by an array of transistors, and, on the other side, is coupled to the interconnecting cable of the LAN. In one embodiment the transformer is driven by an array of four transistors. This array comprises two pairs of a PNP-NPN combination. One pair of PNP-NPN transistors is turned on simultaneously while the other pair is turned off. This creates a pulse through the primary of the transformer which is coupled to the secondary thereof. The transformer secondary is coupled to the interconnecting LAN cable. When each pair of PNP-NPN transistors is off, a high impedance is maintained across the LAN line. A relatively lower impedance is reflected onto the LAN line only during signal transmission.

OBJECTS OF THE INVENTION

It is therefore an object of the present invention to provide an interface device for a LAN.

It is another object of the present invention to provide a LAN transmitter using only a simple output transformer comprised of primary winding and a secondary winding.

It is a further object of the present invention to provide an interface device for a LAN which is simple in design and capable of providing a voltage output swing suitable to various LAN protocols.

Other objects and features of the present invention will become apparent from the following detailed description of the invention considered in connection with the accompanying drawings. It is to be understood, however, that the drawings are designed for purposes of illustration only and not as a definition of the limits of the invention for which reference should be made to the appended claims.

BRIEF DESCRIPTION OF THE DRAWINGS

In the drawings, wherein the same reference numeral denotes the same element throughout the several views.

DETAILED DESCRIPTION OF THE INVENTION

Figure 1:
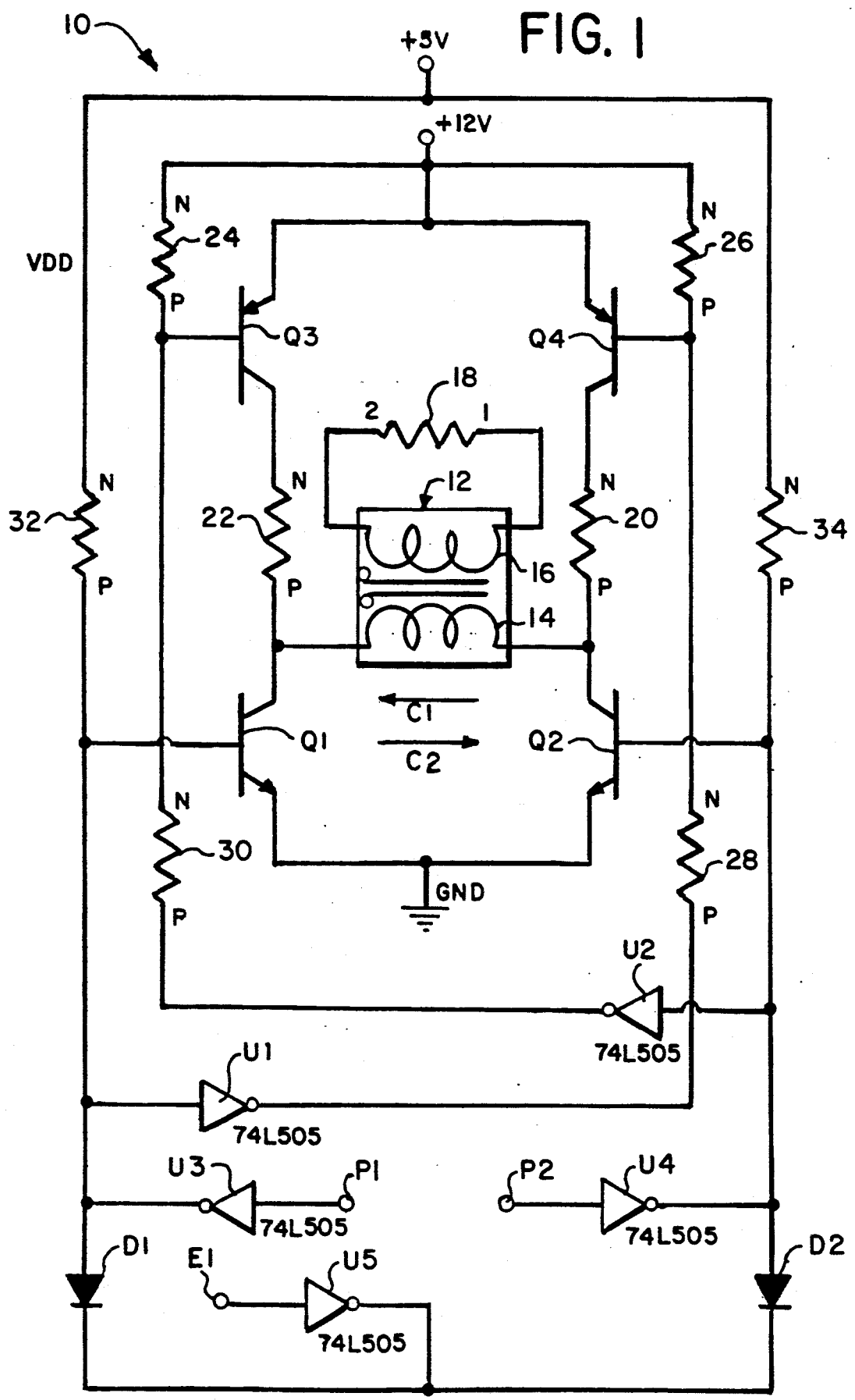
FIG. 1 shows one embodiment of the present invention.

As seen in FIG. 1, the LAN interface or line driver of the present invention, generally referred to by reference numeral 10, comprises a pulse or driver transformer 12 having a primary winding 14 and a secondary winding 16. Secondary winding 16 is coupled to the LAN interconnecting cable diagrammatically represented by the lumped impedance 18. Paired PNP and NPN transistors Q3 and Q4; Q1 and Q2 respectively are arrayed in a quad configuration in circuit around the primary winding 14 of the transformer 12. More particularly, the NPN transistor Q1 and PNP transistor Q4 form one or a first pair of PNP-NPN transistors while NPN transistor Q2 and PNP transistor Q3 form the other or second pair of PNP-NPN transistors that drives winding 14. The collector of Q1 is tied to the collector of Q4 through the primary winding 14 and a resistor 20. In a mirror image construction, the collector of Q2 is tied to the collector of Q3 through the primary winding 14 and a resistor 22. Thus the construction or circuit layout of transistors Q1-Q4 shown in FIG. 1 resembles a type of differential arrangement.

The emitters of the PNP transistors Q3 and Q4 are tied to a +12 volt source while the collectors of the NPN transistors Q1 and Q2 are tied to ground. The bases of the PNP transistors Q3 and Q4 are tied to the +12 volt source via resistors 24 and 26 respectively. A first inverter U1 is connected via its output to the base of transistor Q4 through the resistor 28 while a second inverter U2 is connected via its output to the base of Q3 through resistor 30. The output of a third inverter U3 is connected to the input of the first inverter U1 and also to the base of transistor Q1. In similar manner the output of a fourth inverter U4 is connected to the input of inverter U1 and the base of transistor Q2. The base of each transistor Q1 and Q2 is tied to a source of +5 volts through a pair of resistors 32 and 34 respectively.

A pair of diodes D1 and D2 are connected across the inverter U3 and U4 so that the cathodes of diodes D1 and D2 are tied together and connected jointly to the output of an inverter U5. The anode of diode D1 is conjointly connected to the output of U3, input of U1 and base of Q1 as shown. Similarly, the anode of diode D2 is conjointly connected to the output of U4, the input of U2 and the base of Q2 as shown The input of inverter U3 is coupled to a data signal input P1 and the input of inverter U4 is coupled to a data signal P2. The input of inverter U5 is connected to a disable signal or voltage input E1 during use and operation of the invention as will be described.

In use and operation an enable voltage E1 (logic low) is applied to the input of inverter U5. By operation of respective inverters, transistors Q1–Q4 are then enabled. In this condition, when a logic low signal pulse appears on input P1, inverter U3 applies a positive bias (pulse) to Q1 turning the same on while inverter U1 applies an inverted or logic low bias (pulse) to transistor Q4 turning the same on. Current is sent through winding 14 in the direction of arrow C1. In a similar manner and when a logic low signal pulse appears on input P2, inverter U4 applies a positive bias (pulse) to transistor Q2 turning the same on while inverter U2 applies an inverted or logic low bias (pulse) to transistor Q3 turning the same on. Current is sent through winding 14 in the direction of arrow C2.

Current pulses through the winding 14 of the transformer 12 are coupled to the secondary winding 16 thereof and onto the LAN cable represented by lumped impedance 18. The operation of the embodiment of FIG. 1 might be described as a kind of differential switching arrangement that, when PNP-NPN transistor pair Q4 and Q1 are turned on, PNP-NPN transistor pair Q3 and Q2 are turned off, and vice versa. When no signal is applied, transistors Q1–Q4 are cut off and thus a relatively high impedance is reflected through transformer 12 to the LAN output line.

Figure 2:
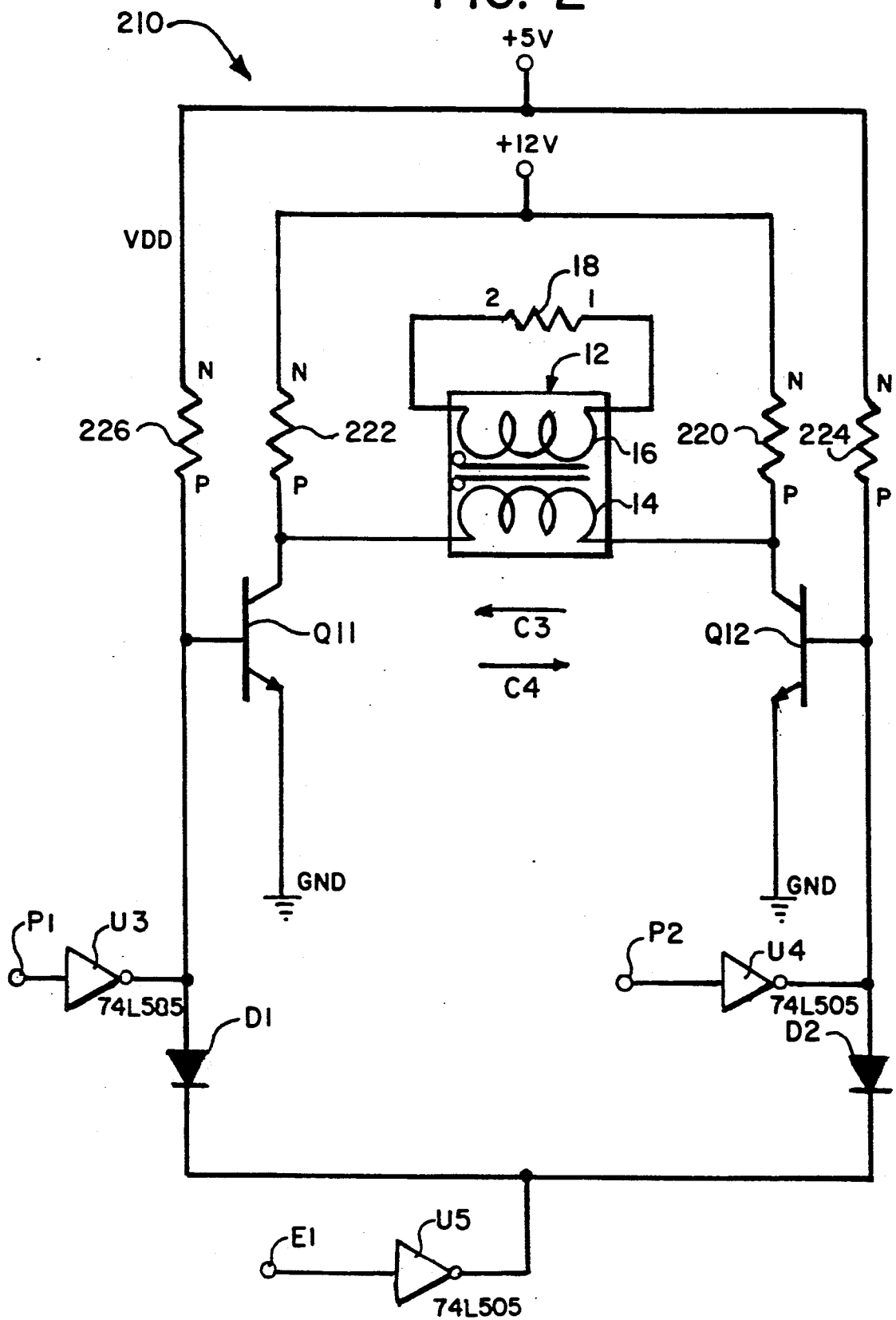
FIG. 2 shows another embodiment of the present invention.

Turning now to FIG. 2 there is shown another embodiment of the present invention seen generally as reference numeral 210. A pair of NPN transistors Q11 and Q12 have their respective collectors connected to respective ends of winding 14 of transformer 12. One end of resistors 220 and 222 are respectively connected to the collectors of transistors Q12 and Q11. The other end of these resistors are tied to +12 volts. One end of resistors 224 and 226 are respectively connected to the bases of transistors Q12 and Q11. The other end of these resistors are tied to +5 volts. Circuit elements comprising inverters U3–U5, and diodes D1 and D2 are connected substantially as described above with reference to FIG. 1.

Use and operation of the embodiment of FIG. 2 is as follows. When U5 is enabled as noted above, the logic low pulse or data signal applied to the input of inverter U3 is inverted into a positive signal (pulse) which is applied to the base of Q11. This positive signal turns on transistor Q11 in synchrony with the data train appearing at the output of U3. When Q11 is momentarily turned on, a corresponding pulse of current passes through winding 14 in the direction of arrow C3. In a similar manner, a negative pulse or data signal applied to the input of inverter U4 is inverted by the same into a positive signal (pulse). This signal (pulse) is applied to the base of Q12 turning the same on in synchrony with the data train appearing at the output of U4. When the positive pulse turns on Q12 a corresponding pulse of current passes through winding 14 in the direction of arrow C4. Pulses C3 and C4 induce corresponding data pulses in winding 16. These data pulses are coupled into the LAN line which is diagrammatically represented by characteristic impedance 18.

When data is not being sent, transistors Q11 and Q12 are shut off. In their off state, the transistors present a high impedance which, though reflected onto the LAN line by means of transformer 12, does not appreciably load the same.

Of course, the PNP-NPN transistor pairs shown in FIG. 1 can be replaced by all PNP devices or all NPN devices with suitable changes made in the output of the driving inverters. Indeed, the bipolar devices shown might be replaced with FETs with, of course, suitable changes made to the polarity of driving inverters.

The individual inverters shown in FIG. 1 and 2 are from a standard 74LS05 Hex Inverter package.

As is seen from the foregoing, the system of the present invention for providing high impedance matching output on a coaxial cable load comprises two pairs of transistors Q1 through and Q4 arranged in circuit with a driver transformer. The transistors are arranged in diagonal relationship wherein a single transister in each pair is fired with the transister in the other pair. The transisters being arranged so that they oscillate between off and on conditions dependent upon the nature of the input of P1 and P2 termnals as seen in the drawings. The transistors produce a high impedance on the primary winding of the transformer in the direction dependent on the input signal to P1 and P2. The system is highly simple in its circuitry as well as effectively reliable. The transformer does not have a center tap and its secondary winding is a single winding which winding is connected only to the core and shield of a coaxial cable as illustrated by the load 18. The active circuit is not permanently biased to establish a high impedence during both transmission and reception in the LAN, nor are any feed back loops provided.

Various modifications and changes have been illustrated and defined herein. Nevertheless other changes and modifications can be made hereto without departing from the spirit and scope hereof.

What is claimed is:

1. A line driver for LAN wherein the devices of the LAN are interconnected by wiring comprising a pulse transformer having a primary and secondary winding, said secondary winding being connected to the LAN line, a first pair of transistors and a second pair of transistors, the primary winding of said pulse transformer being connected between said first and second pair of transistor; and means for switching each of said transistors between an "off" state and an "on" state to send a pulse through said primary winding to induce a pulse in said secondary winding propagating a pulse in the wiring of the LAN, said first pair of transistors comprising a PNP transistor and an NPN transistor, said second pair of transistors comprising a PNP transistor and an NPN transistor, said switching means comprising a first inverter U1 having an input and an output coupled to the base of the PNP transistor of said first transistor pair, a second inverter U2 having an input and an output coupled to the base of the PNP transistor of said second transistor pair, a first signal input inverter U3 having an output connected conjointly to the input of said first inverter U1 and the base of the NPN transistor of said first transistor pair, a second signal input inverter U4 having an output connected conjointly to the input of said second inverter U2 and the base of the NPN transistor of said second transistor pair.

2. A line driver for LAN wherein the devices of the LAN are interconnected by wiring comprising a pulse transformer having a primary and secondary winding, said secondary winding being connected to the LAN line, a first pair of transistors and a second pair of transistors, the primary winding of said pulse transformer being connected between said first and second pair of transistor, and means for switching each of said transistors between an "off" state and an "on" state to send a pulse through said primary winding to induce a pulse in said secondary winding propagating a pulse in the wiring of the LAN, said first pair of transistors comprising a PNP transistor and an NPN transistor, said second pair of transistors comprising a PNP transistor and an NPN transistor, said switching means comprising a first inverter U1 having an input and an output coupled to the base of the PNP transistor of said first transistor pair, a second inverter U2 having an input and an output coupled to the base of the PNP transistor of said second transistor pair, a first signal input inverter U3 having an output connected conjointly to the input of said first inverter U1 and the base of the NPN transistor of said first transistor pair, a second signal input inverter U4 having an output connected conjointly to the input of said second inverter U2 and the base of the NPN transistor of said second transistor pair and means for disabling the operation of said first and second pair of transistors whereby said transistors remain in their "off" state.

3. The line driver of claim 2, said disabling means including a first diode and a second diode cathodes of which being connected together; the anode of said first diode being connected conjointly to the output of said first signal inverter U3, the input of said first inverter U1 and the base of the NPN transistor of said first transistor pair; the anode of said second diode being connected conjointly to the output of said second signal inverter U4, the input of said second inverter U2 and the base of the NPN transistor of said second transistor pair; and a fifth inverter U5 the output of which is connected to the cathodes of said first and second diodes for applying a disabling bias thereto.

4. Apparatus for coupling data onto a LAN line comprising a pulse transformer having a primary and second winding, said secondary winding being connected to the LAN line, a first transistor and a second transistor, the collectors of each transistor respectively coupled to a given side of the primary winding, a first inverter whose output is connected to the base of said first transistor and which is adapted to turn said first transistor on, a second inverter whose output is connected to the base of said second transistor and which is adapted to turn said second transistor on, said first and second transistors each being biased such that when no signal is applied to the input of said first and second inverters, each transistor is shut off thus presenting a high impedance across the LAN line, and when a signal is applied to a corresponding input of said first and second inverters, the output of said inverters respectively drives said first and second transistors to an "on" state thereby sending a pulse through said primary winding which induces a pulse in said secondary winding that is applied to the LAN line and includes means for disabling the operation of said first and second transistors and thereby maintain said transistors in their "off" and high impedance state.

5. The apparatus of claim 4, said disabling means including a first diode and a second diode, the cathodes of which are connected together; the anode of said first diode being conjointly connected to the output of said first inverter and the base of said first transistor; the anode of said second diode being conjointly connected to the output of said second inverter and the base of said second transistor; and a third inverter the output of which is connected to the cathodes of said first and second diodes for applying a disabling bias thereto.

* * * * *